United States Patent
Yasuda et al.

(10) Patent No.: US 9,063,421 B2
(45) Date of Patent: Jun. 23, 2015

(54) CHEMICALLY AMPLIFIED POSITIVE RESIST COMPOSITION AND PATTERN FORMING PROCESS

(71) Applicant: Shin-Etsu Chemical Co., Ltd., Tokyo (JP)

(72) Inventors: Hiroyuki Yasuda, Annaka (JP); Katsuya Takemura, Joetsu (JP); Shohei Tagami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/283,967

(22) Filed: May 21, 2014

(65) Prior Publication Data
US 2014/0255833 A1 Sep. 11, 2014

Related U.S. Application Data

(63) Continuation-in-part of application No. 13/678,868, filed on Nov. 16, 2012.

(30) Foreign Application Priority Data

Nov. 17, 2011 (JP) .................. 2011-251496

(51) Int. Cl.
*G03F 7/004* (2006.01)
*G03F 7/40* (2006.01)
*G03F 7/039* (2006.01)
*H01L 21/027* (2006.01)
*H05K 1/09* (2006.01)

(52) U.S. Cl.
CPC ............. *G03F 7/0392* (2013.01); *G03F 7/40* (2013.01); *H01L 21/0274* (2013.01); *H05K 1/095* (2013.01)

(58) Field of Classification Search
CPC ...... G03F 7/004; G03F 7/0392; G03F 7/0045; G03F 7/0385; G03F 7/40; H01L 21/0271; H01L 21/0274; H05K 1/095
USPC ........... 430/270.1, 927, 913, 280.1, 330, 331, 430/322
See application file for complete search history.

(56) References Cited

U.S. PATENT DOCUMENTS

| | | | |
|---|---|---|---|
| 3,957,512 | A | 5/1976 | Kleeberg et al. |
| 6,522,795 | B1 | 2/2003 | Jordan et al. |
| 2010/0119973 | A1 | 5/2010 | Takita |
| 2011/0177302 | A1 | 7/2011 | Takita |

FOREIGN PATENT DOCUMENTS

| | | |
|---|---|---|
| JP | 49-115541 A | 11/1974 |
| JP | 59-108031 A | 6/1984 |
| JP | 2002-014307 A | 1/2002 |
| JP | 2004-002753 A | 1/2004 |
| JP | 2004-190008 A | 7/2004 |
| JP | 2006-106214 A | 4/2006 |
| JP | 2008-304902 A | 12/2008 |
| JP | 2009-258723 A | 11/2009 |
| JP | 2012-189875 A | 10/2012 |

OTHER PUBLICATIONS

"Japan Polyimide Research Association, New Polyimide-Fundamental and Application," 2002, pp. 328-329 and 337-340.

*Primary Examiner* — Amanda C Walke
(74) *Attorney, Agent, or Firm* — Birch, Stewart, Kolasch & Birch, LLP

(57) ABSTRACT

A chemically amplified positive resist composition comprising (A) 100 pbw of a base resin which is normally alkali insoluble or substantially insoluble, (B) 0.05-20 pbw of a photoacid generator, (C) 0.1-50 pbw of a thermal crosslinker, and (D) 50-5,000 pbw of an organic solvent is coated to form a thick film having a high sensitivity and resolution.

8 Claims, No Drawings

CHEMICALLY AMPLIFIED POSITIVE RESIST COMPOSITION AND PATTERN FORMING PROCESS

CROSS REFERENCE TO RELATED APPLICATION

This application is a continuation-in-part of copending application Ser. No. 13/678,868 filed on Nov. 16, 2012, the entire contents of which are hereby incorporated by reference.

TECHNICAL FIELD

This invention relates to a chemically amplified positive resist composition and a pattern forming process capable of forming a thick-film resist pattern with a high sensitivity and resolution.

BACKGROUND ART

While the recent trend is toward higher integration and size enlargement of microelectronic devices, there is a demand for resin-encapsulated packages of thin profile and reduced size. It is accordingly required that the surface protective layer and interlayer dielectric film in semiconductor devices and the re-distribution layer of semiconductor packages be formed of materials having better electric properties, heat resistance and mechanical properties. Polyimide resins are one class of materials that meet the required properties. For example, polyimide resins can be modified to be photosensitive. Attempts are made to use such photosensitive polyimide resins, because the pattern forming process can be simplified and the complex manufacture process can be shortened. See Patent Documents 1 and 2.

A film of polyimide resin is generally prepared by reacting tetracarboxylic dianhydride with diamine to form a polyimide precursor (or polyamic acid), applying a solution or varnish of the polyimide precursor to form a thin coating such as by spin coating, and causing thermal cyclo-dehydration or ring-closing reaction. See Non-Patent Document 1. Through this cyclo-dehydration step, the polyimide resin is cured. In the case of polyimide resins resulting from polyimide precursors, however, a problem arises that volume shrinkage attributable to dehydration or imidization can occur upon curing, leading to a loss of film thickness and a lowering of dimensional accuracy. Nowadays, it is desired to form a film at low temperature. What is needed in this sense is a polyimide resin which can be subjected to cyclo-dehydration at low temperature to form a film having physical properties comparable to those of the film obtained from cyclo-dehydration at high temperature. Nevertheless, when the polyimide precursor is cured at low temperature, the cured film becomes brittle or degraded in physical properties because of incomplete imidization.

On the other hand, studies are made on photosensitive resins based on other heat resistant polymers which do not need cyclo-dehydration unlike the polyimide precursors. See Patent Documents 3 to 6. Particularly in such applications as the re-distribution layer in semiconductor packages, a positive photosensitive resin composition which is developable in alkaline aqueous solution and yet can form a pattern having high heat resistance is needed from the aspect of environmental load reduction.

Although the positive photosensitive resin composition which is developable in alkaline aqueous solution has some acceptable properties including heat resistance, further improvements in sensitivity and resolution are needed.

CITATION LIST

Patent Document 1: JP-A S49-115541 (U.S. Pat. No. 3,957,512)
Patent Document 2: JP-A S59-108031
Patent Document 3: JP-A 2006-106214
Patent Document 4: JP-A 2004-002753
Patent Document 5: JP-A 2004-190008
Patent Document 6: JP-A 2002-014307 (U.S. Pat. No. 6,522,795)
Non-Patent Document 1: Japan Polyimide Research Association, New Polyimide—Fundamental and Application—, 2002

SUMMARY OF INVENTION

An object of the invention is to provide a chemically amplified positive resist composition which exhibits a high sensitivity and resolution, and is adapted to form a thick film via alkaline aqueous solution development and subsequently a cured film having high heat resistance via post-development heat treatment. Another object is to provide a pattern forming process and a cured resist pattern film obtained therefrom.

The inventors have found that the above and other objects are attained by forming a pattern from a chemically amplified positive resist composition comprising a polymer comprising recurring units having the general formula (1) as a base resin, and an epoxy or oxetane resin of bisphenol A, cresol novolak or polyfunctional type as a thermal crosslinker.

In one aspect, the invention provides a chemically amplified positive resist composition comprising (A) 100 parts by weight of a base resin, (B) 0.05 to 20 parts by weight of a photoacid generator, (C) 0.1 to 50 parts by weight of a thermal crosslinker, and (D) 50 to 5,000 parts by weight of an organic solvent. The base resin is a polymer comprising recurring units having the general formula (1) and not including recurring units having an epoxy group and/or oxetanyl group:

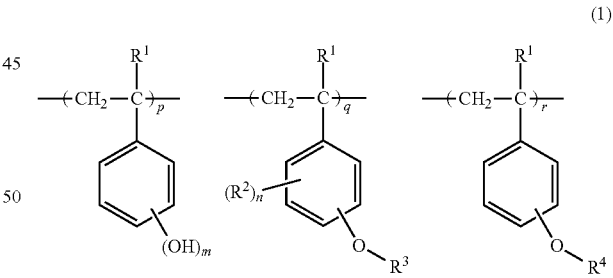

wherein $R^1$ is each independently hydrogen, hydroxyl, straight or branched alkyl, or trifluoromethyl, $R^2$ is hydrogen, hydroxyl, or trifluoromethyl, $R^3$ is $C_4$-$C_{20}$ tertiary alkyl, $R^4$ is an acid labile group exclusive of tertiary alkyl, n is 0 or an integer of 1 to 4, m is 0 or an integer of 1 to 5, p, q and r each are 0 or a positive number, meeting $0 < p+q+r \leq 1$, the polymer having a weight average molecular weight of 1,000 to 500,000.

The thermal crosslinker (C) is an epoxy or oxetane resin of cresol novolak type, or polyfunctional type having a monovalent hydrocarbon group on phenyl.

In a preferred embodiment, the thermal crosslinker is at least one selected from the group consisting of phenol novolak epoxy resins, cresol novolak epoxy resins, triphenylmethane epoxy resins, alicyclic epoxy resins, glycidyl ester resins, glycidylamine resins, and oxetane resins of phenol novolak, cresol novolak and diglycidyl bisphenol types.

The resist composition may further comprise (E) 0.01 to 2 parts by weight of a basic compound.

In another aspect, the invention provides a pattern forming process comprising applying the chemically amplified positive resist composition defined above onto a substrate to form a resist film, exposing a selected region of the resist film, developing, and optionally heating the resist pattern film resulting from the development step at 100 to 250° C. to form a cured resist pattern film.

Also contemplated herein is a cured resist pattern film obtained by the pattern forming process.

Advantageous Effects of Invention

The chemically amplified positive resist composition has advantages including satisfactory sensitivity, resolution, development and pattern profile. A satisfactory cured resist pattern film can be formed via development and subsequent heat treatment.

DESCRIPTION OF PREFERRED EMBODIMENTS

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$—$C_m$) means a group containing from n to m carbon atoms per group.

The abbreviations and acronyms have the following meaning.
Mw: weight average molecular weight
Mn: number average molecular weight
Mw/Mn: molecular weight distribution or dispersity
GPC: gel permeation chromatography
PEB: post-exposure bake
PAG: photoacid generator One embodiment of the invention provides a chemically amplified positive resist composition comprising (A) a base resin, (B) a PAG, (C) a thermal crosslinker, and (D) an organic solvent. The base resin (A) used herein is a polymer comprising recurring units represented by the general formula (1) and having a weight average molecular weight (Mw) of 1,000 to 500,000. The polymer used for the base resin (A) in the present invention does not include recurring units having an epoxy group and/or oxetanyl group.

(1)

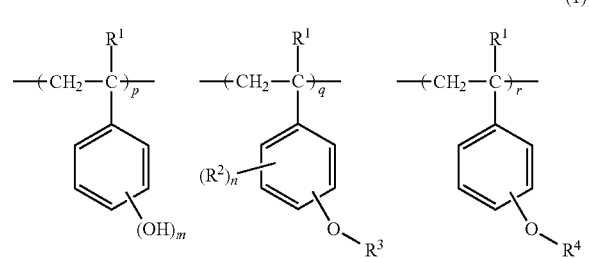

Herein $R^1$ is each independently hydrogen, hydroxyl, straight or branched alkyl, or trifluoromethyl, $R^2$ is hydrogen, hydroxyl, or trifluoromethyl, $R^3$ is $C_4$-$C_{20}$ tertiary alkyl, $R^4$ is an acid labile group exclusive of tertiary alkyl, n is 0 or an integer of 1 to 4, m is 0 or an integer of 1 to 5, p, q and r each are 0 or a positive number, meeting $0<p+q+r\leq 1$.

Examples of the straight or branched alkyl group of $R^1$ include methyl, ethyl, propyl, isopropyl, n-butyl, iso-butyl, and tert-butyl. The tertiary alkyl group of $R^3$ may be branched or cyclic and typically has 4 to 20 carbon atoms, preferably 4 to 12 carbon atoms. Examples include tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl.

$R^4$ is an acid labile group with the proviso that tertiary alkyl is excluded. Preferred groups $OR^4$ include groups having the general formulae (2) and (3), trialkylsiloxy groups in which each alkyl moiety has 1 to 6 carbon atoms, $C_4$-$C_{20}$ oxoalkoxy groups, tetrahydropyranyloxy and tetrahydrofuranyloxy groups.

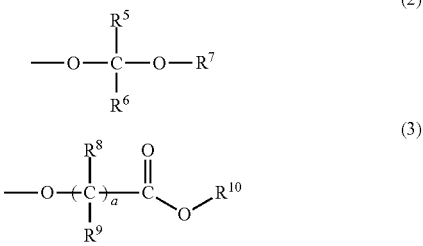

Herein $R^5$, $R^6$, $R^7$, $R^8$ and $R^9$ are each independently hydrogen or a straight or branched $C_1$-$C_8$ alkyl group. $R^{10}$ is a monovalent $C_1$-$C_{18}$ hydrocarbon group which may be separated by an oxygen atom. A pair of $R^5$ and $R^6$, $R^5$ and $R^7$, or $R^6$ and $R^7$ may bond together to form a ring, each participant of $R^5$, $R^6$ and $R^7$ is a straight or branched $C_1$-$C_{18}$ alkylene group when they form a ring. $R^{10}$ is a straight, branched or cyclic $C_4$-$C_{40}$ alkyl group, and a is 0 or an integer of 1 to 4.

Examples of the group having formula (2) include methoxyethoxy, ethoxyethoxy, n-propoxyethoxy, isopropoxyethoxy, n-butoxyethoxy, isobutoxyethoxy, tert-butoxyethoxy, cyclohexyloxyethoxy, methoxypropoxy, ethoxypropoxy, 1-methoxy-1-methylethoxy, and 1-ethoxy-1-methylethoxy. Examples of the group having formula (3) include tert-butoxycarbonyloxy, tert-butoxycarbonylmethyloxy, ethylcyclopentylcarbonyloxy, ethylcyclohexylcarbonyloxy, and methylcyclopentylcarbonyloxy. Suitable trialkylsiloxy groups are those having $C_1$-$C_6$ alkyl such as trimethylsiloxy.

In formula (1), each of p, q and r is 0 or a positive number. When properties of the resist composition are taken into account, p, q and r are preferably numbers falling in the range: $0\leq p/(p+q+r)\leq 0.8$, more preferably $0.2\leq p/(p+q+r)\leq 0.8$; $0\leq q/(p+q+r)\leq 0.5$, more preferably $0\leq q/(p+q+r)\leq 0.3$; and $0\leq r/(p+q+r)\leq 0.5$, more preferably $0\leq r/(p+q+r)\leq 0.35$. Outside the range, a too large value of p may lead to a higher alkaline dissolution rate in the unexposed region. The size and profile of a pattern can be controlled as appropriate by selecting the values of p, q and r in the above ranges. It is noted that the sum of p, q and r is in the range: $0<p+q+r\leq 1$, most preferably p+q+r=1. That is, the polymer comprises units of at least one type selected from p units, q units, and r units, and preferably consists of p units and q units and/or r units.

The polymer should preferably have a weight average molecular weight (Mw) in the range of 1,000 to 500,000, and more preferably 2,000 to 30,000, as measured by GPC versus polystyrene standards. With too low a Mw, the resist composition may become less heat resistant. A polymer with too high a Mw may lose alkaline solubility and give rise to a footing phenomenon after pattern formation.

The polymer used herein may be synthesized by any desired methods, for example, by dissolving acetoxystyrene and amyloxystyrene monomers in an organic solvent, adding a radical initiator thereto, effecting heat polymerization, and subjecting the resulting polymer to alkaline hydrolysis in the organic solvent to deprotect the acetoxy group, thereby obtaining a hydroxystyrene-amyloxystyrene copolymer. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. For the alkaline hydrolysis, aqueous ammonia, triethylamine or the like may be used as the base. The reaction temperature is −20° C. to 100° C., preferably 0° C. to 60° C., and the reaction time is 0.2 to 100 hours, preferably 0.5 to 20 hours.

It is further possible that once the resulting polymer is isolated, an acid labile group having formula (2) or (3) be introduced into the phenolic hydroxyl group portion thereof. For example, a haloalkyl ether compound is used and reacted with a phenolic hydroxyl group on the polymer in the presence of a base, thereby obtaining a polymer in which phenolic hydroxyl groups are, in part, protected with alkoxylalkyl groups.

The solvent used in this reaction is preferably selected from aprotic polar solvents such as acetonitrile, acetone, dimethylformamide, dimethylacetamide, tetrahydrofuran and dimethyl sulfoxide, which may be used alone or in admixture. Preferred examples of the base include triethylamine, pyridine, diisopropylamine, and potassium carbonate. The amount of the haloalkyl ether compound used is preferably at least 10 mol % based on the moles of phenolic hydroxyl groups on the polymer. The reaction temperature is −50° C. to 100° C., preferably 0° C. to 60° C., and the reaction time is 0.5 to 100 hours, preferably 1 to 20 hours.

Also, an acid labile group having formula (3) may be introduced by reacting a dialkyl dicarbonate compound or alkoxycarbonylalkyl halide with the polymer in a solvent in the presence of a base. The solvent used in this reaction is preferably selected from aprotic polar solvents such as acetonitrile, acetone, dimethylformamide, dimethylacetamide, tetrahydrofuran and dimethyl sulfoxide, which may be used alone or in admixture. Preferred examples of the base include triethylamine, pyridine, imidazole, diisopropylamine, and potassium carbonate. The amount of the reactant used is preferably at least 10 mol % based on the moles of phenolic hydroxyl groups on the polymer. The reaction temperature is 0° C. to 100° C., preferably 0° C. to 60° C., and the reaction time is 0.2 to 100 hours, preferably 1 to 10 hours.

Exemplary of the dialkyl dicarbonate compound are di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide and tert-butoxycarbonylethyl chloride.

It is noted that the synthesis is not limited to the aforementioned processes.

The PAG (B) is a compound capable of generating an acid upon exposure to high-energy radiation. Preferred PAGs are sulfonium salts, iodonium salts, sulfonyldiazomethane and N-sulfonyloxyimide acid generators. These PAGs are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyl)oxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, phloroglycinol, catechol, resorcinol, and hydroquinone, in which all hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Glyoxime derivative photoacid generators include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these PAGs, the bissulfonyldiazomethane and N-sulfonyloxyimide compounds are preferred.

In the chemically amplified positive resist composition, an appropriate amount of the PAG (B) is 0.05 to 20 parts, preferably 1 to 10 parts by weight per 100 parts by weight of the base resin (A). Less than 0.05 pbw of the PAG may fail to provide a sufficient contrast (difference of dissolution rate in developer between exposed and unexposed regions) whereas more than 20 pbw may adversely affect resolution due to light absorption of the PAG itself.

Component (C) is a thermal crosslinker. The thermal crosslinker causes the resist composition to cure via crosslinkage by condensation or addition reaction between the crosslinker and phenolic hydroxyl groups in the resist composition or between crosslinker molecules. Particularly when the adhesion, heat resistance, electric insulation and mechanical properties of the cured film are taken into account, a resin having at least two epoxy or oxetane groups per molecule is appropriate. Suitable epoxy compounds include phenol novolak epoxy resins, cresol novolak epoxy resins, triphenylmethane epoxy resins such as triphenylolpropane triglycidyl ether, alicyclic epoxy resins such as 3,4-epoxycyclohexylmethyl-3,4-epoxycyclohexane carboxylate, glycidyl ester resins such as diglycidyl phthalate, diglycidyl hexahydrophthalate, and dimethylglycidyl phthalate, and glycidylamine resins such as tetraglycidyldiaminodiphenylmethane, triglycidyl-p-aminophenol, diglycidylaniline, diglycidyltoluidine, and tetraglycidyl bisaminomethyl cyclohexane. Suitable oxetane resins include those of phenol novolak, cresol novolak and diglycidyl bisphenol types like the foregoing epoxy resins.

The thermal crosslinker may be used alone or in admixture. An appropriate amount of the thermal crosslinker used is 0.1 to 50 parts, preferably 2 to 30 parts by weight per 100 parts by weight of the base resin (A). Less than 0.1 pbw of the thermal crosslinker may fail to achieve a sufficient crosslink density whereas more than 50 pbw may adversely affect transparency due to light absorption of the crosslinker itself, or shelf stability.

Prior to use of the resist composition, the foregoing components are dissolved in (D) an organic solvent. The organic solvent used herein is not particularly limited as long as the components are soluble therein and the resulting solution is effectively applicable. Suitable organic solvents include cellosolve solvents such as methyl cellosolve, ethyl cellosolve, methyl cellosolve acetate, and ethyl cellosolve acetate; propylene glycol solvents such as propylene glycol monomethyl ether, propylene glycol monobutyl ether, propylene glycol monomethyl ether acetate (PGMEA), propylene glycol dimethyl ether, and propylene glycol monoethyl ether acetate; ester solvents such as butyl acetate, amyl acetate, methyl lactate, ethyl lactate, 3-methoxypropionic acid, and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; and highly polar solvents such as N,N-dimethylformamide and N-methylpyrrolidone, and mixtures of any two or more of the foregoing.

The solvent is used in an amount of 50 to 5,000 parts, preferably 100 to 2,000 parts by weight per 100 parts by weight of the base resin (A). A composition containing less than 50 pbw of the solvent is difficult to coat onto a wafer whereas a composition containing more than 5,000 pbw of the solvent may fail to provide a sufficient coating thickness.

Optionally the resist composition may comprise (E) a basic compound. The basic compound (E) is preferably a compound capable of suppressing the rate of diffusion when the acid generated by the PAG diffuses within the resist film. The inclusion of the basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compounds may be used alone or in admixture of two or more. The basic compound is typically formulated in an amount of 0 to 2 parts, and when used, in an amount of 0.01 to 20 parts, more preferably 0.01 to 1 part by weight, per 100 parts by weight of the base resin (A). More than 2 pbw of the basic compound may result in too low a sensitivity.

If desired, any additives such as leveling agents, dyes, pigments and surfactants may be added to the resist composition. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). These surfactants may be used alone or in admixture.

In the resist composition, the surfactant is preferably formulated in an amount of up to 2 parts, and especially up to 1 part by weight, per 100 parts by weight of the base resin (A).

Below described is the pattern forming process using the chemically amplified positive resist composition defined herein. The resist composition is applied onto a substrate by any of conventional techniques such as dipping, spin coating and roll coating, and optionally prebaked on a heater means such as hot plate or oven to form a resist layer. The substrate used herein may be typically a silicon wafer or a plastic or ceramic circuit substrate. The resist layer preferably has a thickness of 0.1 to 50 µm, more preferably 1 to 30 µm. Typically the resist layer is formed as a thick film in the range of 1 to 10 µm.

Next, using an exposure tool such as a stepper or mask aligner, a selected region of the resist layer is exposed to radiation having a wide range of wavelength, for example, UV radiation such as g or i-line, through a photomask. In the practice of the invention, the PEB step is preferably omitted because the desired pattern is not eventually obtainable from the resist composition if the resist film is baked (PEB).

After exposure, the resist film is developed in a developer. The developer used herein may be any of well-known alkaline developer solutions, typically an aqueous solution of tetramethylammonium hydroxide (TMAH). Development may be performed by standard techniques, for example, by immersing the film in the developer. This is optionally followed by cleaning, rinsing and drying, obtaining the desired pattern.

The chemically amplified positive resist composition is insoluble or substantially insoluble in an alkaline developer because some phenolic hydroxyl groups are protected with acid labile groups. Once the resist film is exposed, acid labile groups in the exposed region are deprotected from the phenolic hydroxyl groups under the action of an acid generated by the PAG upon exposure, whereby the exposed region is dissolved in the alkaline developer, leaving the desired positive pattern.

The resulting pattern is then heated in an oven or hot plate at 100 to 250° C. for about 10 minutes to 10 hours. This heat treatment of the film serves to increase the crosslink density and remove any residual volatile components, resulting in a cured film having heat resistance, transparency, low dielectric characteristics, and solvent resistance.

The cured film resulting from the chemically amplified positive resist composition has advantages including good adhesion to the substrate, heat resistance, electrical insulating properties, and mechanical properties, and thus finds application as protective film on electric and electronic components and semiconductor devices.

EXAMPLE

Examples of the invention are given below by way of illustration and not by way of limitation.

Examples 1 to 18

A resist solution was prepared by dissolving amounts (shown in Table 1) of a base resin comprising recurring units shown below (Polymer-1 or 2), a photoacid generator (PAG-1 or 2), a thermal crosslinker (Linkers-1 to 6), a basic compound (Amine-1), shown below, and a surfactant X-70-093 (Shin-Etsu Chemical Co., Ltd.) in propylene glycol monomethyl ether acetate (PGMEA), and filtering through a membrane filter with a pore size of 1.0 µm. The resist solution was spin coated onto a 6-inch silicon wafer (having copper deposited thereon by sputtering) and soft baked on a hot plate under the conditions shown in Table 2, forming a resist film of 5.0 µm thick.

Comparative Examples 1 and 2

A comparative resist solution was prepared as in Example 1 except that a base resin comprising recurring units shown below (Polymer-3) was used. The resist solution was similarly spin coated onto a 6-inch silicon wafer (having copper deposited thereon by sputtering) and soft baked on a hot plate under the conditions shown in Table 2, forming a resist film of 5.0 µm thick.

Patterning and Evaluation of Resist Composition

Using an i-line stepper (Nikon Corp., NSR-1755i7A, NA=0.50), the resist film was exposed to i-line through a reticle and developed in a 2.38 wt % TMAH aqueous solution. Specifically, development was carried out by dispensing the developer for 10 seconds while rotating the substrate, and holding stationary the substrate covered with the developer for 40 seconds. Provided that one cycle consists of developer dispensing and stationary holding, the cycle was repeated until none of scum, foreign matter and residue were observed in the space of a 1:1 5-µm line-and-space pattern. Table 2 reports an optimum number of development cycles repeated. This was followed by deionized water rinsing and drying. The resulting pattern was further heated in an oven at 200° C. for 1 hour, obtaining the desired pattern.

The pattern resulting from hard bake was observed under a scanning electron microscope (SEM). The exposure dose at which the space of a 1:1 5-µm line-and-space pattern was resolved to 5 µm was reported as sensitivity. The results are shown in Table 2. The profile of a 1:1 5-µm line-and-space pattern at that dose is also reported in Table 2.

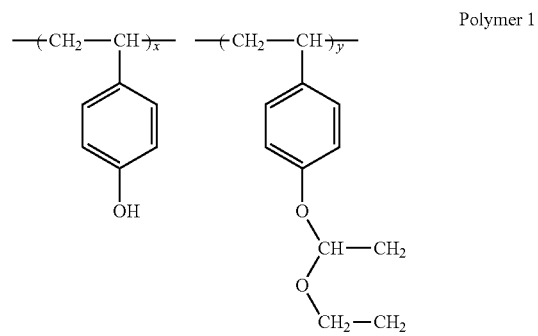

Polymer 1

$x/(x + y) = 0.28$
$Mw = 18,900$
$Mw/Mn = 1.3$

Polymer 2
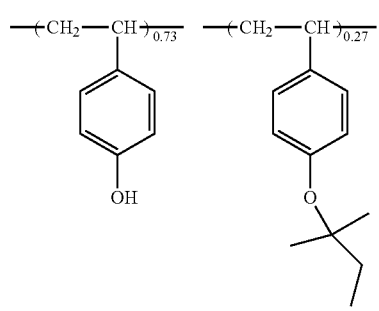
Mw = 7,400
Mw/Mn = 1.05
Polymer 3
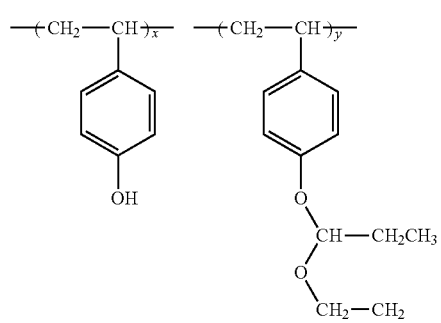
x/(x + y) = 0.50
Mw = 634,000
Mw/Mn = 2.2
PAG-1
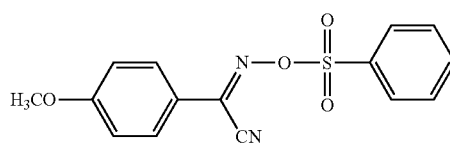
PAG-2
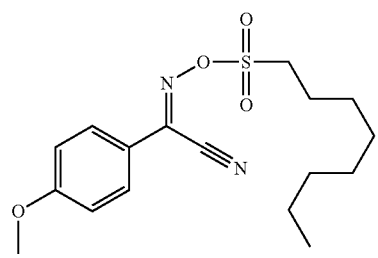
Linker-1
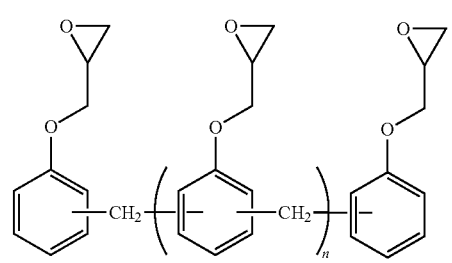
Linker-2
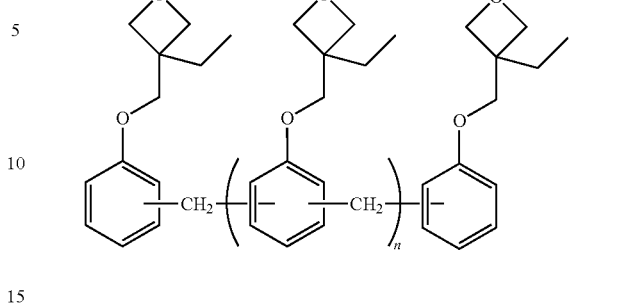
Linker-3
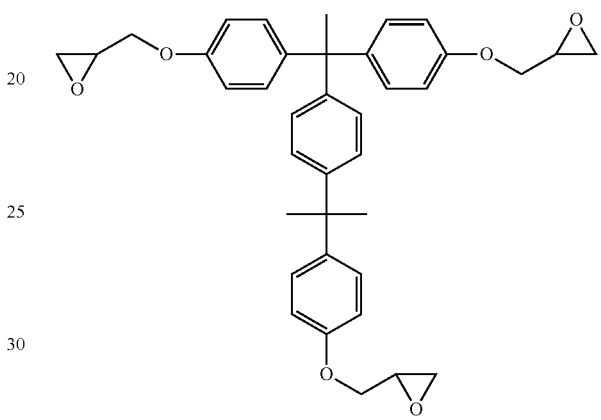
Linker-4
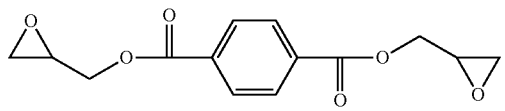
Linker-5
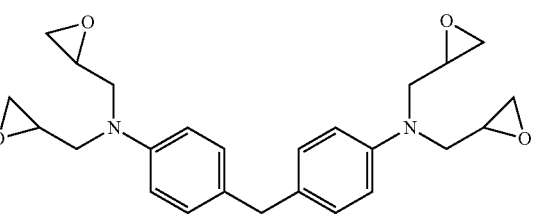
Linker-6
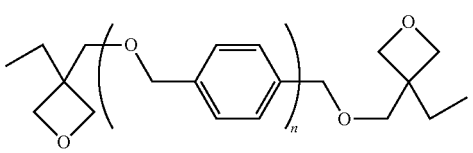
Amine-1
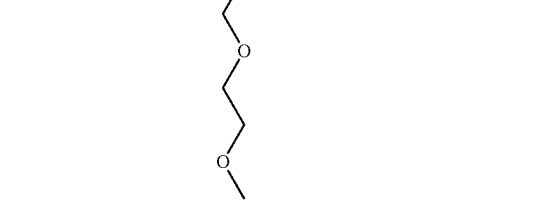

TABLE 1

|  | Base resin (pbw) | PAG (pbw) | Thermal crosslinker (pbw) | Basic compound (pbw) | Surfactant (pbw) | Solvent (pbw) |
|---|---|---|---|---|---|---|
| Example 1 | Polymer-1 (100) | PAG-1 (0.5) | Linker-1 (15) | Amine-1 (0.1) | X-70-093 (0.02) | PGMEA (260) |
| Example 2 | Polymer-1 (100) | PAG-1 (0.5) | Linker-2 (15) | Amine-1 (0.1) | X-70-093 (0.02) | PGMEA (260) |
| Example 3 | Polymer-1 (100) | PAG-1 (0.5) | Linker-3 (15) | Amine-1 (0.1) | X-70-093 (0.02) | PGMEA (260) |
| Example 4 | Polymer-1 (100) | PAG-1 (0.5) | Linker-4 (15) | Amine-1 (0.1) | X-70-093 (0.02) | PGMEA (260) |
| Example 5 | Polymer-1 (100) | PAG-1 (0.5) | Linker-5 (15) | Amine-1 (0.1) | X-70-093 (0.02) | PGMEA (260) |
| Example 6 | Polymer-1 (100) | PAG-1 (0.5) | Linker-6 (15) | Amine-1 (0.1) | X-70-093 (0.02) | PGMEA (260) |
| Example 7 | Polymer-1 (100) | PAG-2 (0.6) | Linker-1 (15) | Amine-1 (0.1) | X-70-093 (0.02) | PGMEA (260) |
| Example 8 | Polymer-1 (100) | PAG-2 (0.6) | Linker-2 (15) | Amine-1 (0.1) | X-70-093 (0.02) | PGMEA (260) |
| Example 9 | Polymer-1 (100) | PAG-2 (0.6) | Linker-3 (15) | Amine-1 (0.1) | X-70-093 (0.02) | PGMEA (260) |
| Example 10 | Polymer-1 (100) | PAG-2 (0.6) | Linker-4 (15) | Amine-1 (0.1) | X-70-093 (0.02) | PGMEA (260) |
| Example 11 | Polymer-1 (100) | PAG-2 (0.6) | Linker-5 (15) | Amine-1 (0.1) | X-70-093 (0.02) | PGMEA (260) |
| Example 12 | Polymer-1 (100) | PAG-2 (0.6) | Linker-6 (15) | Amine-1 (0.1) | X-70-093 (0.02) | PGMEA (260) |
| Example 13 | Polymer-2 (100) | PAG-1 (0.5) | Linker-1 (15) | Amine-1 (0.1) | X-70-093 (0.02) | PGMEA (260) |
| Example 14 | Polymer-2 (100) | PAG-1 (0.5) | Linker-2 (15) | Amine-1 (0.1) | X-70-093 (0.02) | PGMEA (260) |
| Example 15 | Polymer-2 (100) | PAG-1 (0.5) | Linker-3 (15) | Amine-1 (0.1) | X-70-093 (0.02) | PGMEA (260) |
| Example 16 | Polymer-2 (100) | PAG-1 (0.5) | Linker-4 (15) | Amine-1 (0.1) | X-70-093 (0.02) | PGMEA (260) |
| Example 17 | Polymer-2 (100) | PAG-1 (0.5) | Linker-5 (15) | Amine-1 (0.1) | X-70-093 (0.02) | PGMEA (260) |
| Example 18 | Polymer-2 (100) | PAG-1 (0.5) | Linker-6 (15) | Amine-1 (0.1) | X-70-093 (0.02) | PGMEA (260) |
| Comparative Example 1 | Polymer-3 (100) | PAG-1 (0.5) | Linker-1 (15) | Amine-1 (0.1) | X-70-093 (0.02) | PGMEA (260) |
| Comparative Example 2 | Polymer-3 (100) | PAG-1 (0.5) | Linker-3 (15) | Amine-1 (0.1) | X-70-093 (0.02) | PGMEA (260) |

TABLE 2

|  | Soft bake | Develop cycles | Hard bake | Sensitivity (mJ/cm$^2$) | Pattern profile |
|---|---|---|---|---|---|
| Example 1 | 100° C. × 120 s | 2 | 200° C. × 1 hr | 200 | rectangular |
| Example 2 | 100° C. × 120 s | 2 | 200° C. × 1 hr | 220 | rectangular |
| Example 3 | 100° C. × 120 s | 2 | 200° C. × 1 hr | 240 | rectangular |
| Example 4 | 100° C. × 120 s | 2 | 200° C. × 1 hr | 240 | rectangular |
| Example 5 | 100° C. × 120 s | 2 | 200° C. × 1 hr | 280 | rectangular |
| Example 6 | 100° C. × 120 s | 2 | 200° C. × 1 hr | 200 | rectangular |
| Example 7 | 100° C. × 120 s | 2 | 200° C. × 1 hr | 200 | rectangular |
| Example 8 | 100° C. × 120 s | 2 | 200° C. × 1 hr | 240 | rectangular |
| Example 9 | 100° C. × 120 s | 2 | 200° C. × 1 hr | 240 | rectangular |
| Example 10 | 100° C. × 120 s | 2 | 200° C. × 1 hr | 220 | rectangular |
| Example 11 | 100° C. × 120 s | 2 | 200° C. × 1 hr | 450 | rectangular |
| Example 12 | 100° C. × 120 s | 2 | 200° C. × 1 hr | 220 | rectangular |
| Example 13 | 100° C. × 120 s | 2 | 200° C. × 1 hr | 300 | rectangular |
| Example 14 | 100° C. × 120 s | 2 | 200° C. × 1 hr | 320 | rectangular |
| Example 15 | 100° C. × 120 s | 2 | 200° C. × 1 hr | 280 | rectangular |
| Example 16 | 100° C. × 120 s | 2 | 200° C. × 1 hr | 280 | rectangular |
| Example 17 | 100° C. × 120 s | 2 | 200° C. × 1 hr | 600 | rectangular |
| Example 18 | 100° C. × 120 s | 2 | 200° C. × 1 hr | 320 | rectangular |
| Comparative Example 1 | 100° C. × 120 s | 10 | — | — | not resolved |
| Comparative Example 2 | 100° C. × 120 s | 10 | — | — | not resolved |

Example 19

The sample of Example 1 was evaluated for solvent resistance. As in Example 1, a resist film was formed on a 6-inch silicon wafer by means of a spin coater, puddle developed in a 2.38 wt % TMAH aqueous solution for 100 seconds, rinsed with deionized water, and heated in an oven at 200° C. for 1 hour, forming a film of 5 μm thick. The wafer having the cured film formed thereon was immersed in N-methyl-2-pyrrolidone (NMP) at room temperature for 30 minutes and rinsed with deionized water. The thickness of the film after immersion was measured and compared with the thickness prior to immersion. A percent film retention was calculated as an index for solvent resistance. The results are shown in Table 3.

Example 20

As in Example 13, the sample of Example 19 was evaluated for solvent resistance. The results are also shown in Table 3.

TABLE 3

| | Film thickness after hard bake | Film thickness after NMP immersion | Film retention |
|---|---|---|---|
| Example 19 | 5.0 μm | 4.9 μm | 98% |
| Example 20 | 5.0 μm | 4.9 μm | 98% |

As seen from Table 2, the compositions of Examples 1 to 18 showed satisfactory sensitivity, resolution, development behavior, and pattern profile, and were proven to be photosensitive materials having satisfactory properties. In Comparative Examples 1 and 2, the film could not be resolved even by increasing the number of development cycles, because the resin had a very high molecular weight. The results of Examples 19 and 20 in Table 3 prove that these compositions have solvent resistance. It has been demonstrated that the chemically amplified positive resist composition comprising the requisite components meets the required properties.

Japanese Patent Application No. 2011-251496 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising
(A) 100 parts by weight of a base resin,
(B) 0.05 to 20 parts by weight of a photoacid generator,
(C) 0.1 to 50 parts by weight of a thermal crosslinker which causes the resist composition to cure via crosslinker by condensation or addition reaction between the crosslinker and phenolic hydroxyl groups in the resist composition or between crosslinker molecules, and
(D) 50 to 5,000 parts by weight of an organic solvent,
said base resin being a polymer, which is insoluble or substantially insoluble in an alkaline developer, consisting of recurring units having the general formula (1) and not including recurring units having an epoxy group or oxetanyl group:

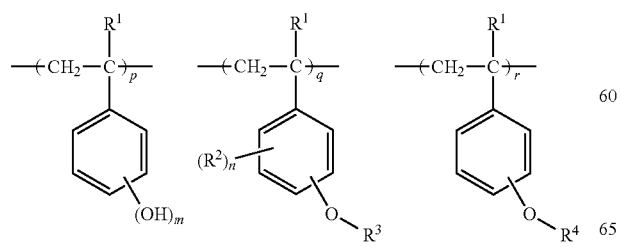

(1)

wherein $R^1$ is each independently hydrogen, hydroxyl, straight or branched alkyl, or trifluoromethyl, $R^2$ is hydrogen, hydroxyl, or trifluoromethyl, $R^3$ is $C_4$-$C_{20}$ tertiary alkyl, $R^4$ is an acid labile group exclusive of tertiary alkyl, n is 0 or an integer of 1 to 4, m is 0 or an integer of 1 to 5, p, q and r are numbers falling in the range: $0.2 \leq p/(p+q+r) \leq 0.8$; $0 \leq q/(p+q+r) \leq 0.5$; $0 \leq r/(p+q+r) \leq 0.5$ and; $p+q+r=1$, the polymer having a weight average molecular weight of 1,000 to 500,000, and said thermal crosslinker being an epoxy or oxetane resin of cresol novolak type, or polyfunctional type having a monovalent hydrocarbon group on phenyl.

2. The resist composition of claim 1 wherein the thermal crosslinker is at least one selected from the group consisting of phenol novolak epoxy resins, cresol novolak epoxy resins, triphenylmethane epoxy resins, alicyclic epoxy resins, glycidyl ester resins, glycidylamine resins, and oxetane resins of phenol novolak, cresol novolak and diglycidyl bisphenol types.

3. The resist composition of claim 1, further comprising (E) 0.01 to 2 parts by weight of a basic compound.

4. A pattern forming process comprising applying the chemically amplified positive resist composition of claim 1 onto a substrate to form a resist film, exposing a selected region of the resist film, and developing.

5. The pattern forming process of claim 4, further comprising the step of heating the resist pattern film resulting from the development step at 100 to 250° C. to form a cured resist pattern film.

6. A cured resist pattern film obtained by the pattern forming process of claim 5.

7. The resist composition of claim 3 wherein the basic compound is an amine represented by the following formula:

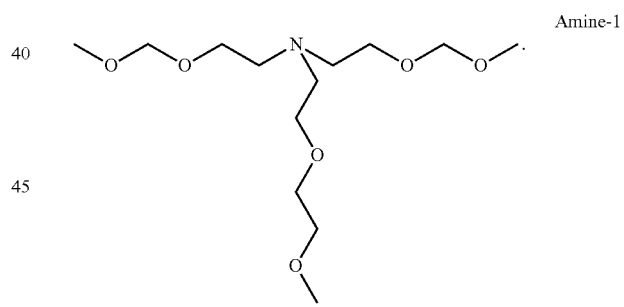

Amine-1

8. A chemically amplified positive resist composition comprising
(A) 100 parts by weight of a base resin,
(B) 0.05 to 20 parts by weight of a photoacid generator,
(C) 0.1 to 50 parts by weight of a thermal crosslinker which causes the resist composition to cure via crosslinker by condensation or addition reaction between the crosslinker and phenolic hydroxyl groups in the resist composition or between crosslinker molecules, and
(D) 50 to 5,000 parts by weight of an organic solvent,
said base resin being a polymer, consisting of recurring units having the general formula (1) and not including recurring units having an epoxy group or oxetanyl group:

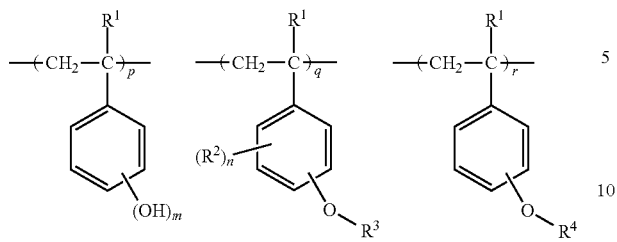

(1)

wherein $R^1$ is each independently hydrogen, hydroxyl, straight or branched alkyl, or trifluoromethyl, $R^2$ is hydrogen, hydroxyl, or trifluoromethyl, $R^3$ is $C_4$-$C_{20}$ tertiary alkyl, $R^4$ is an acid labile group exclusive of tertiary alkyl, n is 0 or an integer of 1 to 4, m is 0 or an integer of 1 to 5, p, q and r are numbers falling in the range: $0.2 \leq p/(p+q+r) \leq 0.8$; $0 \leq q/(p+q+r) \leq 0.5$; $0 \leq r/(p+q+r) \leq 0.5$ and; $p+q+r=1$, the polymer having a weight average molecular weight of 1,000 to 500,000, and said thermal crosslinker being an epoxy or oxetane resin of cresol novolak type, or polyfunctional type having a monovalent hydrocarbon group on phenyl, wherein the composition is insoluble or substantially insoluble in an alkali developer.

* * * * *